(12) United States Patent
Tanabe

(10) Patent No.: US 8,809,939 B2
(45) Date of Patent: Aug. 19, 2014

(54) SEMICONDUCTOR DEVICE

(75) Inventor: Akihito Tanabe, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 840 days.

(21) Appl. No.: 12/532,302

(22) PCT Filed: Mar. 27, 2008

(86) PCT No.: PCT/JP2008/055861
§ 371 (c)(1),
(2), (4) Date: Sep. 21, 2009

(87) PCT Pub. No.: WO2008/123352
PCT Pub. Date: Oct. 16, 2008

(65) Prior Publication Data
US 2010/0044781 A1      Feb. 25, 2010

(30) Foreign Application Priority Data

Mar. 28, 2007   (JP) ................................ 2007-085992

(51) Int. Cl.
*H01L 29/78* (2006.01)

(52) U.S. Cl.
USPC .......................................... 257/327; 257/347

(58) Field of Classification Search
USPC .................................. 257/327, 347, E29.255
See application file for complete search history.

(56) References Cited

U.S. PATENT DOCUMENTS

| | | | |
|---|---|---|---|
| 6,607,948 B1 * | 8/2003 | Sugiyama et al. | 438/151 |
| 6,844,227 B2 * | 1/2005 | Kubo et al. | 438/216 |
| 2002/0109135 A1 * | 8/2002 | Murota et al. | 257/20 |
| 2003/0052334 A1 * | 3/2003 | Lee et al. | 257/200 |
| 2004/0070051 A1 * | 4/2004 | Sugiyama et al. | 257/616 |
| 2006/0118880 A1 * | 6/2006 | Komoda | 257/369 |
| 2007/0013002 A1 * | 1/2007 | Schruefer | 257/347 |

FOREIGN PATENT DOCUMENTS

EP     WO2005/064686 A     7/2005

(Continued)

OTHER PUBLICATIONS

International Search Report for PCT/JP2008/055861 mailed Jun. 24, 2008.
H. Shang et al., "High Mobility p-channel Germanium MOSFETs with a Thin Ge Oxynitride Gate Dielectric", IEDM Technical Digest, Dec. 2002, pp. 441-444.

(Continued)

*Primary Examiner* — Ha Tran T Nguyen
*Assistant Examiner* — Jordan Klein
(74) *Attorney, Agent, or Firm* — McGinn IP Law Group, PLLC

(57) ABSTRACT

To suppress short channel effects and obtain a high driving current by means of a semiconductor device having an MISFET wherein a material having high mobility and high dielectric constant, such as germanium, is used for a channel. A p-type well is formed on a surface of a p-type silicon substrate. A silicon germanium layer having a dielectric constant higher than that of the p-type silicon substrate is formed to have a thickness of 30 nm or less on the p-type well. Then, on the silicon germanium layer, a germanium layer having a dielectric constant higher than that of the silicon germanium layer is formed to have a thickness of 3-40 nm by epitaxial growing. The germanium layer is permitted to be a channel region; and a gate insulating film, a gate electrode, a side wall insulating film, an n-type impurity diffusion region and a silicide layer are formed.

17 Claims, 9 Drawing Sheets

(56) References Cited

FOREIGN PATENT DOCUMENTS

| JP | 04-280682 A | 10/1992 |
| JP | H07321213 A | 12/1995 |
| JP | 2000077658 A | 3/2000 |
| JP | 2002-237590 A | 8/2002 |
| JP | 2006-165335 A | 6/2006 |
| JP | 2008-511169 A | 4/2008 |
| WO | WO 2006/023183 A2 | 3/2006 |

OTHER PUBLICATIONS

C. Yeo et al., "Electron Mobility Enhancement Using Ultrathin Pure Ge on Si Substrate", IEEE Electron Device Letters, vol. 26, No. 10, Oct. 2005, pp. 761-763.

J. Nakatsuru et al., "Growth of high quality Ge epitaxial layer on Si(100) substrate using ultra thin Si0.5Ge0.5 buffer", Materials Reseach Society symposium proceedings, vol. 891, 2006, pp. 758-763.

Japanese Office Action for JP2009-509160 mailed on Feb. 5, 2013.

Japanese Office Action dated May 7, 2013, with English translation.

\* cited by examiner

SEMICONDUCTOR DEVICE

This Application is the National Phase of PCT/JP2008/055861 filed on Mar. 27, 2008, which claims the Priority right based on Japanese Patent Application No. 2007-085992 filed on Mar. 28, 2007, and the disclosure thereof is hereby incorporated by reference in its entirety.

TECHNICAL FIELD

The present invention relates to a semiconductor device having MISFET (Metal Insulator Semiconductor Field Effect Transistor) and, more specifically, to a semiconductor device whose channel is formed with a semiconductor of a high dielectric constant.

BACKGROUND ART

Recently, the speed of MISFET has been increased mainly through micronization of the gate length and the like. However, shortened gate length, i.e., shortened channel length, causes phenomena such as reduction in a threshold value so called a short channel effect and deterioration (increase) of S-value that is an index of slope in a current-voltage characteristic of a sub-threshold area. In order to suppress the short channel effect, various techniques for increasing the mobility have been investigated since the mobility of carries is deteriorated when an impurity concentration in the channel area is increased.

As a way of example, there is disclosed a technique which uses germanium as described in the following. The carrier mobility of germanium is about 2.6 times as high in electrons and about 4.2 times as high in positive holes compared to the case of silicon. Therefore, such technique has drawn an attention as a future-generation technique.

For example, Non-Patent Document 1 discloses to form MISFET on a germanium substrate 101 as shown in FIG. 8. In FIG. 8, a p-type well 112 is formed on the p-type germanium substrate 101, and a gate insulating film 106 and a gate electrode 107 are formed thereon. N-type impurity diffusion regions 109 are formed by diffusing n-type impurities into the p-type well 112 to configure source/drain, and the n-type impurity diffusion regions 109 are provided by being isolated from each other while partially overlapping with both ends of the gate insulating film. Reference numeral 108 is a sidewall insulating film.

Further, Non-Patent Document 2 discloses to form a channel region by performing epitaxial growth of a germanium layer 103 on a silicon substrate 102 as shown in FIG. 9. In FIG. 9, a p-type well 112 is formed on the p-type silicon substrate 102. The germanium layer 103 is formed thereon by performing epitaxial growth, and a thin silicon layer 104 is further formed thereon. A gate insulating film 106 and a gate electrode 107 are formed on the silicon layer 104. N-type impurity diffusion regions 109 as a pair including a part of the germanium layer 103 and the silicon layer 104 are formed on the p-type well 112, while being isolated from each other by partially overlapping with both ends of the gate insulating film.

Non-Patent Document 1: H. Shang et al., "High Mobility p-channel Germanium MOSFETs with a Thin Ge Oxynitride Gate Dielectric", IEDM Technical Digest, pp. 441-444, December 2002.

Non-Patent Document 2: C. C. Yeo et al., "Electron Mobility Enhancement Using Ultrathin Pure Ge on Si Substrate", IEEE Electron Device Letters, Vol. 26, No. 10, pp. 761-763, October 2005.

DISCLOSURE OF THE INVENTION

Problems to be Solved by the Invention

However, there is such an issue in the MISFET disclosed in Non-Patent Document 1 that it exhibits a larger short channel effect than that of MISFET formed on a silicon substrate provided that the impurity concentration of the wells are same. The short channel effect occurs due to a depletion layer which extends from the source and drain towards the channel direction, and the effects thereof are extensive in a device with the short gate length. The length of the depletion layer is proportional to a square root of a dielectric constant of a substance which configures the channel region. Since the dielectric constant of germanium is larger than that of silicon, the depletion layer becomes longer and the short channel effect becomes larger. Therefore, there is also such an issue that the carrier mobility becomes deteriorated when the impurity concentration of the channel is increased for suppressing the short channel effect.

Further, in the MISFET disclosed in Non-Patent Document 2, the layer of germanium is thin. The Inventor of the present invention has come to find out that the short channel effect is suppressed in the case of such structure to be about the same level as that of the MISFET formed on the silicon substrate. However, there is a following issue with the MISFET of Non-Patent Document 2. Germanium is formed on the silicon substrate by performing epitaxial growth. In other words, germanium is grown in such a manner that the grating interval thereof in a direction that is in parallel to the substrate is same as the interval of silicon that has a different grating constant. Thus, a compression distortion is applied to the germanium. A film thickness with which no dislocation is introduced in germanium is called a critical film thickness, and it is about 2 nm or less with the condition of the MISFET of Non-Patent Document 2. In the meantime, the range where the carriers are distributed is about 3 nm from the interface with respect to the gate insulating film. Thus, the carriers also travel on the silicon layer whose carrier mobility is lower than that of germanium. Therefore, the current (drive current) when the gate electrode is on becomes deteriorated compared to a case where the carriers run only on germanium.

It is an object of the present invention to suppress the short channel effect and to obtain a high drive current with a semiconductor device having MISFET in which a material with a high mobility and a high dielectric constant, such as germanium, is used for the channel.

Means for Solving the Problems

In order to achieve the foregoing object, a semiconductor device according to the present invention includes, on a substrate: a semiconductor region including two or more semiconductor layers of different dielectric constants; a gate insulating film which covers the semiconductor region; and a gate electrode formed on the gate insulating film, wherein, among the semiconductor layers, a film thickness of the semiconductor layer for forming a channel region is defined so as to implement a structure where a short channel effect is suppressed without deteriorating a drive current flown in the channel region.

Effects of the Invention

The present invention makes it possible to suppress the short channel effect and to obtain a high drive current with a semiconductor device having MISFET in which a material with a high mobility and high dielectric constant, such as germanium, is used for the channel.

BEST MODES FOR CARRYING OUT THE INVENTION

Hereinafter, exemplary embodiments of the present invention will be described in a concretive manner by referring to the accompanying drawings. First, a first exemplary embodiment of the present invention will be described. FIG. 1 is a sectional view showing a semiconductor device according to the first exemplary embodiment.

As shown in FIG. 1, a p-type well 12 is formed on a surface of a p-type silicon substrate 1. A silicon germanium layer 2 and a germanium layer 3 are formed thereon in order from the p-type well 12 side. The germanium content of the silicon germanium layer 2 is 20-80%. Further, a preferable film thickness of the silicon germanium layer 2 is 30 nm or less, and a preferable film thickness of the germanium layer 3 is 3-40 nm. The silicon germanium layer 2 and the germanium layer 3 are formed by a CVD (Chemical Vapor Deposition) method or an MBE (Molecular Beam Epitaxy) method.

N-type impurity diffusion regions 9 in a pair are formed by being isolated from each other through diffusing impurities in a part of a semiconductor region 20 that is configured with the p-type well 12, the silicon germanium layer 2, and the germanium layer 3. This pair of n-type impurity diffusion regions 9 configures the source and drain of MISFET. Further, the germanium layer 3 sandwiched between the n-type impurity diffusion regions 9 forms a channel region. A gate insulating film 6 is formed to cover the channel region between the source and the drain, and a gate electrode 7 is formed thereon. A sidewall insulating film 8 is formed around the gate insulating film 6 and the gate electrode 7. Further, a silicide layer 13 is formed on the surface of the germanium layer 3 and the gate electrode 7 by silicide chemical reaction. While an element isolation region such as a shallow trench for isolating elements of each MISFET, an interlayer insulating film such as a silicon oxide film covering the entire MISFET, wirings for electrically connecting each MISFET and other elements and the like, etc., are formed in practice, those are omitted from the drawings.

In the followings, the reason for setting the film thickness of the germanium layer as 3-40 nm in this exemplary embodiment will be described. In general, when forming the germanium layer for configuring the channel region of the MISFET, germanium is epitaxial-grown on the silicon substrate. At that time, a compression distortion is applied to the germanium layer, due to the fact that the grating constant of silicon and that of germanium are different. When the film thickness of the germanium layer is increased, dislocation is introduced within the germanium layer, which results in causing a bad influence upon the performance of the MISFET, such as an increase in the leak current. Therefore, it is necessary to form the germanium layer in a thickness with which dislocation is not introduced, and the critical film thickness thereof is about 2 nm. In the meantime, carriers are distributed in the range mainly about 3 nm below the gate insulating film in the channel region of the MISFET, so that the carriers are to run on the silicon layer whose mobility is lower than that of germanium. This causes deterioration of the drive current.

A following fact is reported in a literature by J. Nakatsuru et al., "Growth of high quality Ge epitaxial layer on Si(100) substrate using ultra thin Si0.5Ge0.5 buffer", MRS Fall Meeting Abstracts EE7.24, pp. 758-763, 2005. In the literature, the author et al., epitaxial-grew germanium on a silicon germanium layer as an intermediate layer formed on a silicon layer. As a result, obtained was such an experimental result that even though the germanium layer on the top layer is relaxed because dislocation is introduced in the silicon germanium layer, most of the dislocation remains in the vicinity of the interface between the germanium layer and the silicon germanium layer and does not propagate to the surface of the relaxed germanium layer.

From the literature described above, it can be seen that the germanium layer of an arbitrary film thickness can be obtained by performing epitaxial growth of the germanium layer on the silicon germanium layer.

In a case of a short-channel device, a so-called short channel effect occurs due to a depletion layer extended from the source and drain towards the channel direction. This short channel effect is equivalent to deterioration of a threshold value, deterioration (increase) in S-value, etc., as described above. The length of the depletion layer within the channel region is proportional to a root square of the dielectric constant, so that the short channel effect of a substance having high dielectric constant is large. The dielectric constant of germanium is 16, the dielectric constant of silicon is 11.9, and the dielectric constant of silicon germanium is an intermediate value of the both. Therefore, there are cases where the use of germanium whose channel mobility is higher than that of silicon may not be effective for improving the performance of the MISFET because of the short channel effect.

In the meantime, the Inventor has found that it is effective for suppressing the short channel effect if the film thickness of the germanium in the structure of FIG. 1 is formed thin. FIG. 2 is a graph in which the lateral axis takes the film thickness of the germanium layer and the longitudinal axis takes the S-value, which shows the effect implemented by the film thickness of the germanium layer in regards to suppression of the short channel effect in the MISFET shown in FIG. 1. The condition when measuring the S-value is that the gate length is 40 nm, the film thickness of the gate insulating film in oxide-film conversion is 1 nm, the well concentration is 2E18 $cm^{-3}$, and the drain voltage is 1 V. The film thickness of the silicon germanium layer is fixed at 5 nm, and the germanium content is 50%.

In FIG. 2, the S-value measured regarding the MISFET shown in FIG. 8 is 101 mV/dec., and this value is compared with the S-value measured for the MISFET of this exemplary embodiment. As shown in FIG. 2, it can be seen that when the film thickness of the germanium layer of this exemplary embodiment becomes 40 nm or less, the S-value becomes decreased compared to the case of MISFET shown in FIG. 8. Particularly, when the film thickness of the germanium layer becomes 20 nm or less, the S-value becomes 95 mV/dec. or less. This is more preferable.

As described above, the minimum film thickness of the germanium layer is about 3 nm from the carrier distribution range which contributes to the drive current. If the film thickness is thinner than this, the carriers run on the silicon germanium layer whose carrier mobility is lower than that of germanium. Thus, the drive current becomes deteriorated compared to the case where the carriers run only on the germanium layer. As described above, it is possible to obtain the MISFET of a high drive current while suppressing the short channel effect, through forming the germanium layer 3 with high dielectric constant under the gate insulating film 6 and by setting the film thickness thereof as 3-40 nm.

Next, the reason for setting the film thickness of the silicon germanium layer 2 as 30 nm or less will be described. FIG. 3 is a graph in which the lateral axis takes the film thickness of the silicon germanium layer and the longitudinal axis takes the S-value, which shows the effect implemented by the film thickness of the silicon germanium layer in regards to suppression of the short channel effect in the MISFET shown in FIG. 1. The condition when measuring the S-value is that the germanium content of the silicon germanium layer is 50%, the gate length is 40 nm, the film thickness of the gate insulating film in oxide-film conversion is 1 nm, the well concentration is $2E18$ cm$^{-3}$, and the drain voltage is 1 V. The film thickness of the germanium layer epitaxial-formed on the silicon germanium layer is fixed at 5 nm. In FIG. 3, the comparison target of the S-value is "101 mV/dec." which is measured for the MISFET shown in FIG. 8, as in the case of FIG. 2. As shown in FIG. 3, it can be seen that the S-value is improved to 97 mV/dec. or less in this exemplary embodiment when the film thickness of the silicon germanium layer becomes 60 nm or less. It can be seen from this that the layer lower than the germanium layer on which the carriers mainly run also contributes to the S-value, i.e., to the short channel effect. Further, it can be seen that a more preferable S-value can be obtained when the film thickness of the silicon germanium layer becomes 30 nm or less. Because of the above, it is preferable for the film thickness of the silicon germanium layer 2 in FIG. 1 to be set as 30 nm or less. While the germanium content of the silicon germanium layer in FIG. 3 is the typical content of 50%, it is considered that substantially a same tendency can be observed with the germanium content of this exemplary embodiment, which is within a range of 20-80%.

In this exemplary embodiment, the critical film thickness of the germanium layer 3 can be increased as described above through forming the silicon germanium layer 2 whose dielectric constant is lower than that of germanium and higher than that of silicon under the germanium layer 3. Further, through defining the film thickness, the short channel effect can be suppressed more effectively. Therefore, the germanium layer having high carrier mobility can be utilized effectively, thereby making it possible to obtain the MISFET with a high drive current.

While the semiconductor that comes in contact with the gate insulating film 6 is germanium in the above-described exemplary embodiment, the present invention is not limited only to such case. The gist of the present invention is to obtain the effect of suppressing the short channel effect without deteriorating the drive current through forming three semiconductor layers whose dielectric constants become larger in order from the substrate side and through defining the film thickness of the semiconductor layer that configures the channel region. Therefore, the semiconductor layer that comes in contact with the gate insulating film 6 may be a second silicon germanium whose germanium content is larger than that of the first silicon germanium layer 2 that is an intermediate layer. Further, it is not limited to the case of employing combinations of silicon, silicon germanium, and germanium, as long as the above-described dielectric constant orders thereof are satisfied.

Further, while the substrate in the above-described exemplary embodiment is the silicon substrate 1, the present invention is not limited only to such case. For example, the substrate may be an SOI (Silicon on Insulator) substrate structure in which an insulating film such as a silicon oxide film is formed under silicon.

Furthermore, while the n-type MISFET has been described in the exemplary embodiment above, the present invention is not limited only to the n-type ones. The present invention can be also applied to a p-type MISFET.

Further, the impurity concentrations of germanium and silicon germanium can be set to arbitrary values by adding a gas containing dopant at the time of performing epitaxial growth. It is also possible to employ non-doped ones.

Furthermore, it is also possible to improve the crystal property, the electric property, and the like as necessary, through adjusting the distortion amount by adding carbon having smaller atom radius than silicon and germanium to the silicon germanium 2 and the germanium 3.

Next, a second exemplary embodiment of the present invention will be described. FIG. 4 is a sectional view showing a semiconductor device according to the second exemplary embodiment. Regarding FIG. 4, other than those described below are the same as those of the first exemplary embodiment. Therefore, in FIG. 4, same reference numerals are applied to the same structural elements as those of FIG. 1, and detailed descriptions thereof are omitted.

The semiconductor device of this exemplary embodiment is structured as an MISFET in which a gate insulating film and a gate electrode are formed in a damascene gate structure. As shown in FIG. 4, a silicon germanium layer 21 and a germanium layer 31 are formed in order from a p-type silicon substrate 1 side only between a pair of n-type impurity diffusion regions 9. The silicon germanium layer 21 and the germanium layer 31 configure a semiconductor region having two or more semiconductor layers of different dielectric constants. In FIG. 4, the n-type impurity diffusion regions 9 are formed to be in contact with the semiconductor layer (germanium layer 31) which forms the channel region on the outer side of the semiconductor region (the silicon germanium layer 21 and the germanium layer 31). A gate insulating film 61 and a gate electrode 71 are formed on the germanium layer 31. The structural elements other than those described above are the same as those of the MISFET shown in FIG. 1. In FIG. 4, the element isolation region and the like are not illustrated. Reference numeral 81 is a silicon oxide film.

As in the case of the first exemplary embodiment, the second exemplary embodiment also exhibits the effect of suppressing the short channel effect through forming the germanium layer, the silicon germanium layer, and the silicon layer in order from the ones with the higher dielectric constants in the channel region under the gate insulating film 61. Further, the MISFET of this exemplary embodiment is formed in a damascene structure, which provides advantages as those explained in a manufacturing method described later.

Hereinafter, the manufacturing method of the semiconductor device of the exemplary embodiment shown in FIG. 4 will be described. FIG. 5A-FIG. 5C and FIG. 4 are sectional views which show the semiconductor device manufacturing method according to the exemplary embodiment in order of steps thereof.

As shown in FIG. 5A, the MISFET configured with the p-type well 12, the gate insulating film 62, the n-type impurity diffusion regions 9, the dummy gate electrode 72, and the sidewall insulating film 8 is formed on the p-type silicon substrate 1 by a well-known method. Polysilicon or the like is used for the dummy gate electrode 72. Thereafter, the silicon oxide film 81 is formed to cover the MISFET.

Then, the top part is flattened by CMP (Chemical Mechanical Polishing) as shown in FIG. 5B to have the surface of the dummy gate 72 be exposed.

Subsequently, as shown in FIG. 5C, anisotropic etching is performed on the dummy gate 72, the gate insulating film 62, and the silicon substrate 1. Then, the silicon germanium layer 21 and the germanium layer 31 are formed in the region where the etching was performed through performing selective epitaxial growth in the order described above. Thereafter, the gate insulating film 61 and the gate electrode 71 are formed by a well-known method. Thereby, the semiconductor device shown in FIG. 4 can be obtained. Although not shown, a step of forming the element isolation region may be performed before or after the step of forming the germanium layer 31 and the silicon germanium layer 21.

The n-type impurity diffusion regions 9 are generally formed by performing ion implantation of impurities and a heat treatment at a high temperature. Due to an influence of the heat treatment, there are cases where germanium is diffused to the gate insulating film, causing deterioration of the properties of the gate insulating film and the like. In the manufacturing method of this exemplary embodiment, after forming the n-type impurity diffusion regions 9, the dummy gate electrode 72 and the gate insulating film 62 are removed by etching. Thereafter, the silicon germanium layer 21, the germanium layer 31, and the gate insulating film 61 are formed. In this manner, the germanium layer 31 does not receive the influence of the high-temperature heat treatment. Thus, diffusion of germanium from the germanium layer 31 to the gate insulating film 61 can be suppressed, so that deterioration of the properties of the gate insulating film 61 and of the interface between the gate insulating film 61 and the germanium layer 31 can be prevented.

Next, a third exemplary embodiment of the present invention will be described.

FIG. 6 is a sectional view showing a semiconductor device according to the third exemplary embodiment. Regarding FIG. 6, other than those described below are the same as those of the first and second exemplary embodiments. Therefore, in FIG. 6, same reference numerals are applied to the same structural elements as those of FIG. 1 and FIG. 4, and detailed descriptions thereof are omitted.

The semiconductor device of this exemplary embodiment is the same as that of the second exemplary embodiment described above except that a silicon layer 41 is formed between the gate insulating film 63 and the germanium layer 31. With such configuration, it is possible to use a silicon oxide film and the like as the gate insulating film 63 that has a fine interface property with the silicon layer 41.

The carrier concentration of an inversion layer in the channel region is distributed by having a peak at the depth of about 2 nm from the interface between the gate insulating film 63 and the silicon layer 41. Thus, it is necessary to set the film thickness of the silicon layer 41 to be thinner than the peak depth of the carrier concentration and to be as thin as possible in order to effectively utilize the property of the germanium layer 31 exhibiting high mobility. In the meantime, it is necessary to set the film thickness of the silicon layer 41 to be thick enough so as not to have an influence of diffusion of the germanium layer 31 to the gate insulating film 63 during the manufacturing step. As in the case of the second exemplary embodiment described above, the germanium layer 31 in this exemplary embodiment is not influenced by the high-temperature heat treatment executed at the time of forming the n-type impurity diffusion regions 9. This makes it possible to suppress diffusion of germanium from the geranium layer 31 to the gate insulating film 63, so that the film thickness of the silicon layer 41 can be set thinner.

Next, a fourth exemplary embodiment of the present invention will be described. FIG. 7 is a sectional view showing a semiconductor device according to the fourth exemplary embodiment. Regarding FIG. 7, other than those described below are the same as those of the first exemplary embodiment. Therefore, in FIG. 7, same reference numerals are applied to the same structural elements as those of FIG. 1, and detailed descriptions thereof are omitted.

In this exemplary embodiment, as shown in FIG. 7, a silicon germanium layer 22 and a germanium layer 32 are formed, respectively, between a pair of n-type impurity regions 92 formed away from each other. As the n-type impurity regions 92, silicon germanium or silicon carbide is used, for example. A silicide layer 13 is formed on the surface of the n-type impurity regions 92 and the gate electrode 7. Structures other than those described above are the same as those of the first exemplary embodiment shown in FIG. 1.

Hereinafter, a manufacturing method of the semiconductor device according to the exemplary embodiment will be described. In FIG. 7, after forming a p-type well on the surface of the p-type silicon substrate 1, a silicon germanium layer and a germanium layer are epitaxial-grown in this order on the whole surface of the p-type well. Then, after forming the gate insulating film 6 and the gate electrode 7, etching is applied to process the part of the p-type well, the silicon germanium layer, and the germanium layer where the n-type impurity regions 92 are formed. Thereby, the p-type well 12, the silicon germanium layer 22, and the germanium layer 32 are formed. Subsequently, silicon germanium is epitaxial-grown on this processed part, for example, to form the n-type impurity regions 92. Thereafter, the sidewall insulating film 8 and the silicide layer 13 are formed by a well-known method. Thereby, the semiconductor device shown in FIG. 7 can be obtained.

In this exemplary embodiment, distortion is applied to the channel through epitaxial-growing, on the p-type well 12, the n-type impurity regions 92 made with a material whose grating constant is different from that of the germanium layer 32 where the channel is formed. With this, the carrier mobility becomes increased, which makes it possible to improve the performance of the semiconductor device.

A semiconductor device according to another exemplary embodiment of the present invention may be structured to include: first to third stacked semiconductor layers; a pair of high-concentration impurity regions formed away from each other at least on the first semiconductor layer; a gate insulating film formed to cover the surface of the first semiconductor layer between the pair of high-concentration impurity regions; and a gate electrode formed on the gate insulating film, wherein the second semiconductor layer has a higher dielectric constant than the third semiconductor layer, and the first semiconductor layer has a higher dielectric constant than the second semiconductor layer and has a film thickness of 3-40 nm.

Another semiconductor device according to the present invention may be structured to include: first to third stacked semiconductor layers; a pair of high-concentration impurity regions formed away from each other while being in contact at least with the first semiconductor layer; a gate insulating film formed to cover the surface of the first semiconductor layer between the pair of high-concentration impurity regions; and a gate electrode formed on the gate insulating film, wherein the second semiconductor layer has a higher dielectric constant than the third semiconductor layer, and the first semiconductor layer has a higher dielectric constant than the second semiconductor layer and has a film thickness of 3-40 nm.

In still another exemplary embodiment of the present invention, the second and third semiconductor layers having lower dielectric constants than that of the first semiconductor layer are formed under the first semiconductor layer whose dielectric constant is high. Therefore, the short channel effect can be suppressed. At the same time, through forming the second semiconductor layer, it is possible to form the first semiconductor layer of an arbitrary film thickness with which no dislocation is introduced. As a result, the first semiconductor layer having a high carrier mobility can be utilized effectively, and a high drive current can be obtained. Further, by setting the film thickness of the first semiconductor layer to be 3-40 nm in particular, the short channel effect can be suppressed effectively while using the first semiconductor layer with the high dielectric constant for the channel region.

In this case, the second semiconductor layer may be formed to be in a film thickness of 30 nm or less. This makes it possible to improve the effect for suppressing the short channel effect further.

Furthermore, each of the first to third semiconductor layers may include germanium, silicon germanium, and silicon as the main components or may include first silicon germanium, second silicon germanium having lower germanium concentration than that of the first silicon germanium, and silicon as the main components. In that case, the first semiconductor layer containing germanium as the main component can be formed through performing an epitaxial growth method.

Furthermore, a fourth semiconductor layer may be formed between the first semiconductor layer and the gate insulating film. In that case, the fourth semiconductor layer can contain silicon as the main component. With this, it is possible to use a silicon oxide film or the like as the gate insulating film having a fine interface property with respect to silicon.

Furthermore, the gate insulating film and the gate electrode can be formed to have a damascene gate structure. This makes it possible to prevent germanium contained in the first semiconductor layer from being diffused onto the gate insulating film due to the influence of the high-temperature heat treatment executed when forming the impurity diffusion layer.

Moreover, the first to third semiconductor layers may be formed on an SOI substrate. Further, at least one of the first or the second semiconductor layer may contain carbon.

Furthermore, the pair of high-concentration impurity regions may be formed through performing epitaxial growth. In that case, the impurity layer can contain silicon germanium or silicon carbide as the main component. As described above, through epitaxial-growing a material whose grating constant is different from that of the material used for forming the channel, distortion is applied to the channel. With this, the carrier mobility becomes increased, which makes it possible to improve the performance of the semiconductor device.

While the present invention has been described by referring to the exemplary embodiments (and examples), the present invention is not limited only to those exemplary embodiments (and examples) described above. Various kinds of modifications that occur to those skilled in the art can be applied to the structures and details of the present invention within the scope of the present invention.

Figure 1:
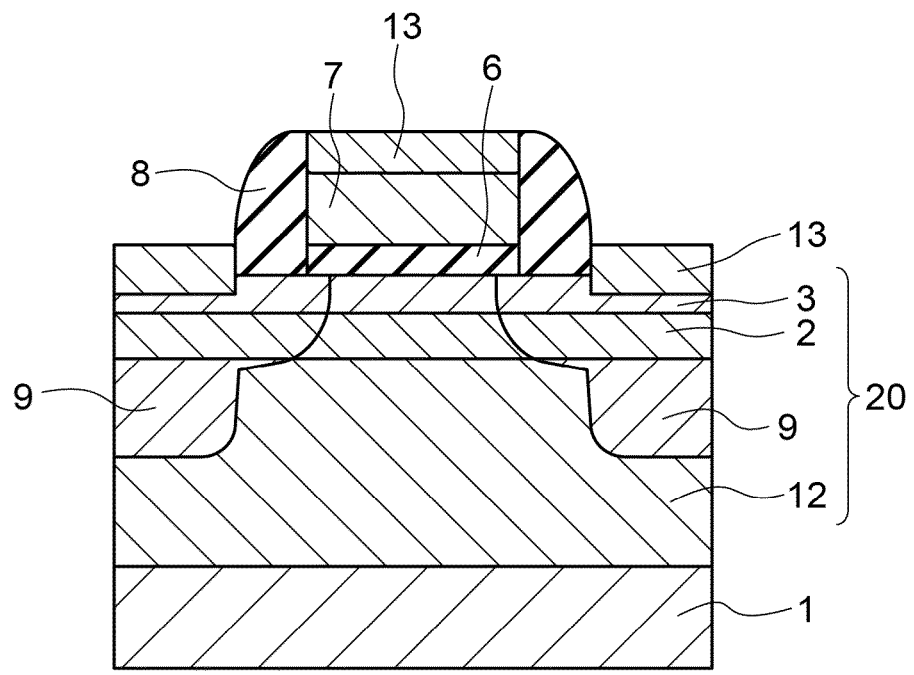
FIG. 1 is a sectional view showing a semiconductor device according to a first exemplary embodiment of the present invention.
Figure 2:
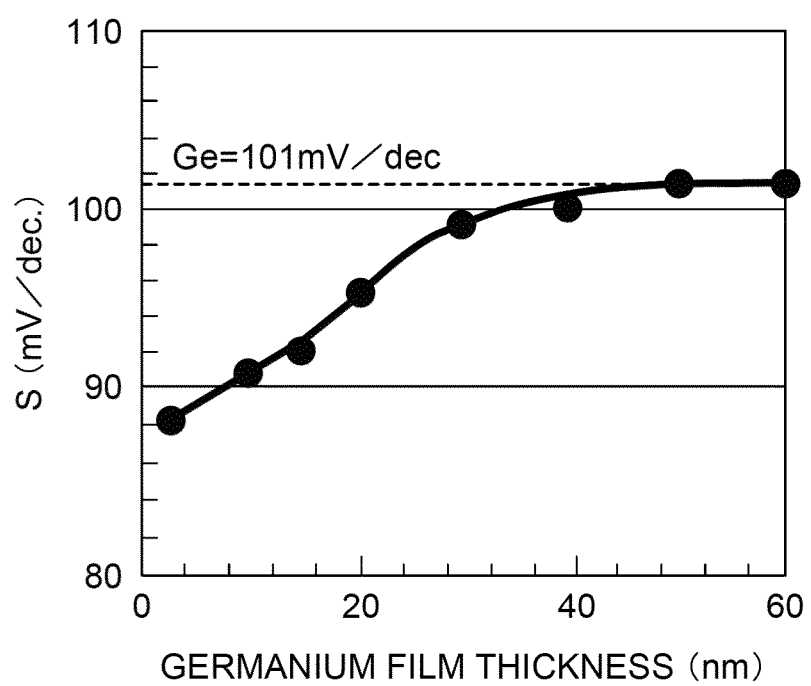
FIG. 2 is a graph in which the lateral axis takes the film thickness of a germanium layer and the vertical axis takes S-values, which shows the effect of the film thickness of the germanium layer for suppressing the short channel effect.
Figure 3:
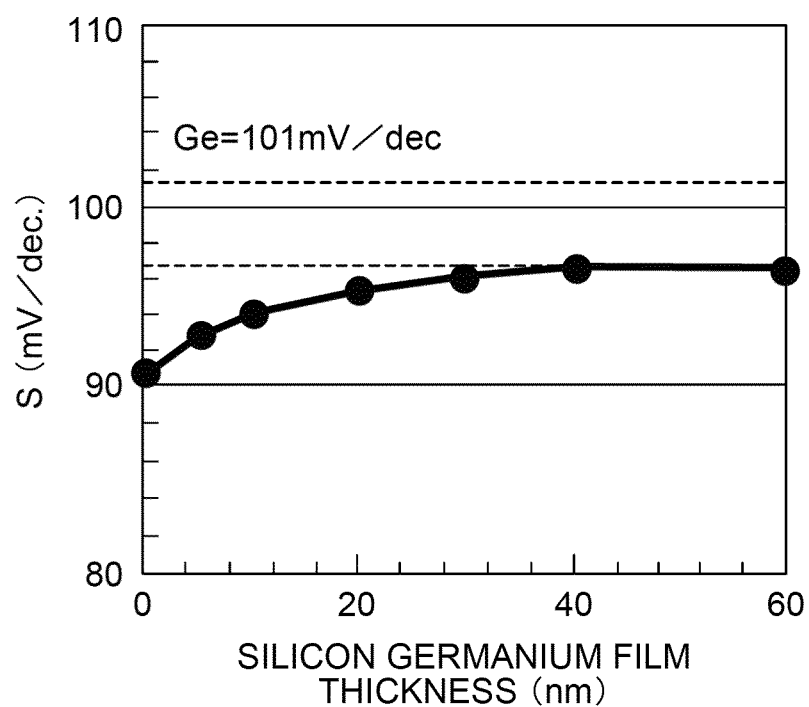
FIG. 3 is a graph in which the lateral axis takes the film thickness of a silicon germanium layer and the vertical axis takes S-values, which shows the effect of the film thickness of the silicon germanium layer for suppressing the short channel effect.
Figure 4:
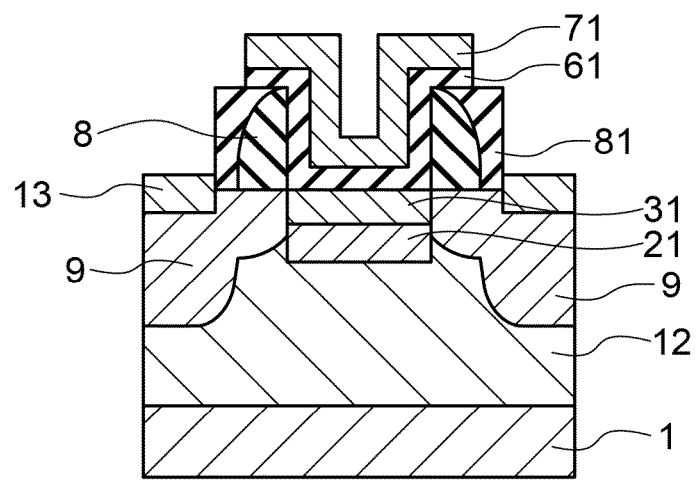
FIG. 4 is a sectional view showing a semiconductor device according to a second exemplary embodiment of the present invention.
Figure 5A:
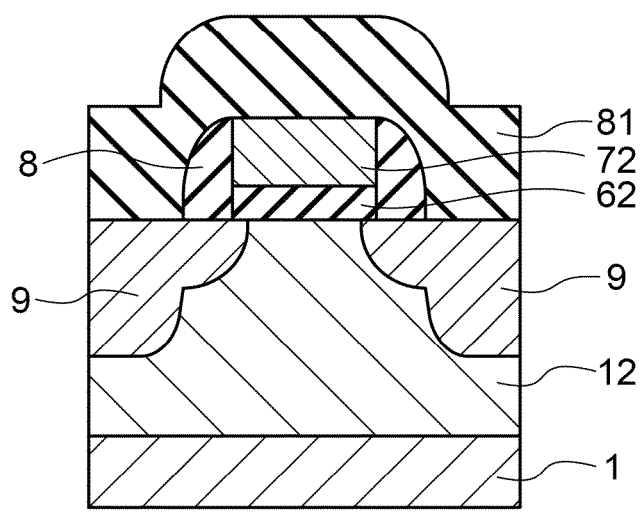
FIGS. 5A-5C are sectional views which illustrate manufacturing steps of the semiconductor device according to the second exemplary embodiment of the present invention.
Figure 5B:
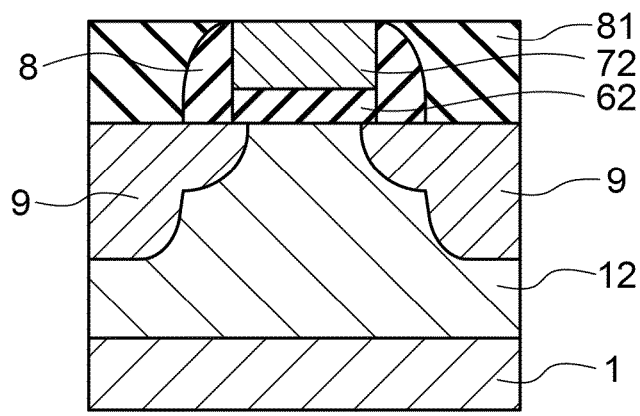
Figure 5C:
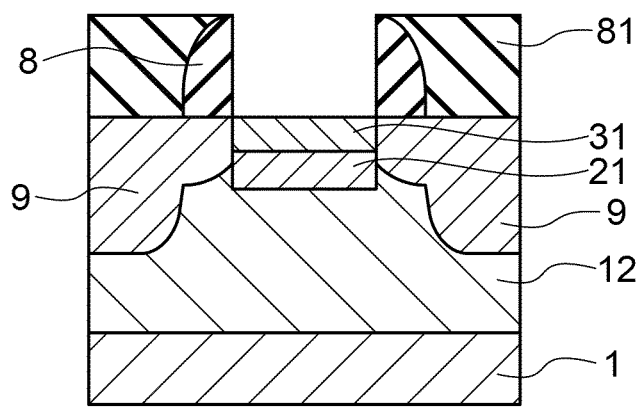
Figure 6:
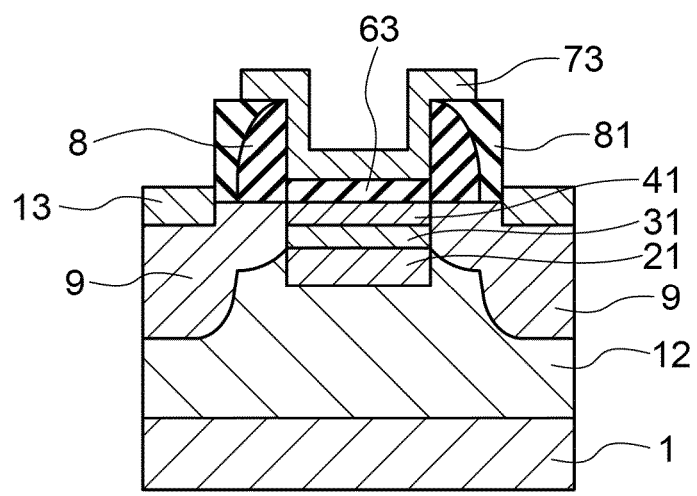
FIG. 6 is a sectional view showing a semiconductor device according to a third exemplary embodiment of the present invention.
Figure 7:
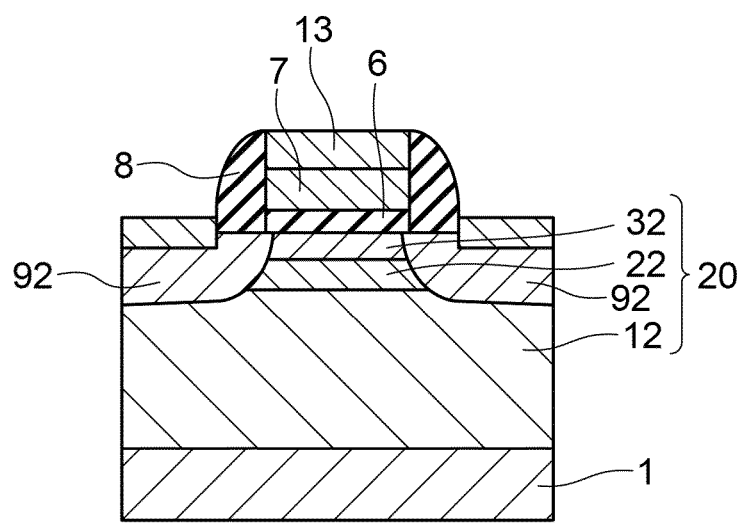
FIG. 7 is a sectional view showing a semiconductor device according to a fourth exemplary embodiment of the present invention.
Figure 8:
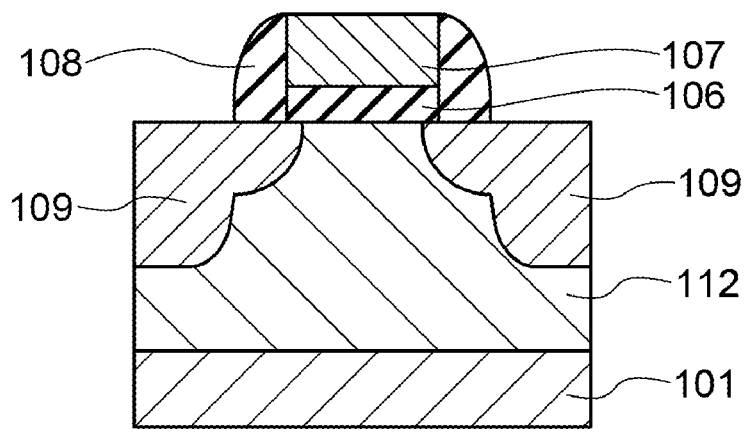
FIG. 8 is a sectional view which schematically shows a semiconductor device depicted in Non-Patent Document 1.
Figure 9:
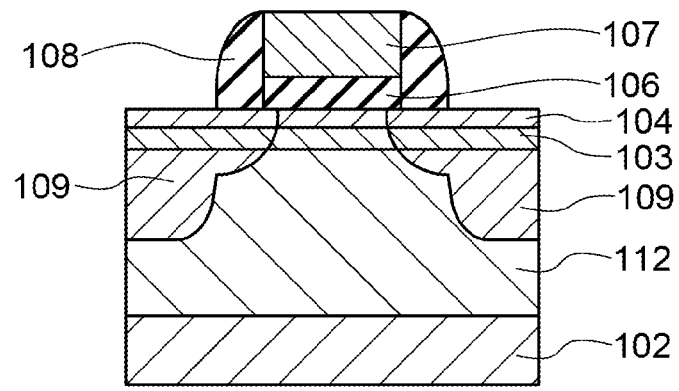
FIG. 9 is a sectional view which schematically shows a semiconductor device depicted in Non-Patent Document 2.

Reference Numerals 1, 102 P-type silicon substrate
101 P-type germanium substrate
12, 112 P-type well
2, 21, 22 Silicon germanium layer
3, 31, 32, 103 Germanium layer
41, 104 Silicon layer
6, 61, 62, 63, 106 Gate insulating film
7, 71, 73, 107 Gate electrode
8, 108 Sidewall insulating film
9, 109 N-type impurity diffusion region
13 Silicide layer
20 Semiconductor region
72 Dummy gate electrode
81 Silicon oxide film
92 N-type impurity region

What is claimed is:

1. A semiconductor device, comprising, on a substrate:
a semiconductor region including at least three semiconductor layers of different dielectric constants;
a gate insulating film which covers the semiconductor region; and
a gate electrode formed on the gate insulating film,
wherein the dielectric constants of the at least three semiconductor layers are set to become larger in order from the substrate side,
wherein one of the semiconductor layers forming a channel region is in contact with the gate insulating film,
wherein an intermediate layer of the semiconductor layers including silicon germanium as a main component thereof has a film thickness of 30 nm or less,
wherein the semiconductor layer forming the channel region has a film thickness of 3 to 40 nm so as to allow carriers to run on only the semiconductor layer including silicon germanium as the main component, and
wherein the semiconductor layer having a maximum dielectric constant includes silicon germanium as a main component thereof, the intermediate semiconductor layer includes silicon germanium having a lower germanium concentration than that of the semiconductor layer having the maximum dielectric constant as a main component thereof, and the semiconductor layer closest to the substrate includes silicon as a main component thereof.

2. The semiconductor device as claimed in claim 1, wherein a high-concentration impurity region is formed by corresponding to the semiconductor layer for forming the channel region among the semiconductor layers of the semiconductor region.

3. The semiconductor device as claimed in claim 2, wherein the high-concentration impurity region is formed within the semiconductor region other than the channel region.

4. The semiconductor device as claimed in claim 2, wherein the high-concentration impurity region is formed to be in contact with a semiconductor layer for forming the channel region, which is outside the semiconductor region.

5. The semiconductor device as claimed in claim 2, wherein the high-concentration impurity region is formed by performing epitaxial growth.

6. The semiconductor device as claimed in claim 5, wherein the high-concentration impurity region includes silicon germanium as a main component.

7. The semiconductor device as claimed in claim 5, wherein the high-concentration impurity region includes silicon carbide as a main component.

8. The semiconductor device as claimed in claim 1, wherein another semiconductor layer is formed between the semiconductor region and the gate insulating film.

9. The semiconductor device as claimed in claim 8, wherein the another semiconductor layer includes silicon as a main component.

10. The semiconductor device as claimed in claim 1, wherein the gate insulating film and the gate electrode have a damascene gate structure.

11. The semiconductor device as claimed in claim 1, wherein the substrate is an SOI substrate.

12. The semiconductor device as claimed in claim 1, wherein the semiconductor layer including the silicon germanium as the main component or the semiconductor layer including the germanium as the main component is formed by an epitaxial growth method.

13. The semiconductor device as claimed in claim 1, wherein at least either the semiconductor layer of the maximum dielectric constant or the semiconductor layer as the intermediate layer includes carbon.

14. The semiconductor device as claimed in claim 1, wherein the semiconductor layer forming the channel region has a film thickness from greater than 35 to and including 40 nm.

15. The semiconductor device as claimed in claim 1, further comprising a well formed on the surface of the substrate.

16. The semiconductor device as claimed in claim 15, wherein the well comprises a p-type or n-type well with a well concentration of at least 2E18 cm$^{-3}$.

17. The semiconductor device as claimed in claim 1, wherein a germanium content of the intermediate layer is 20 to 80%, a germanium content of the one of the semiconductor layers forming the channel region being greater than the germanium content of the intermediate layer, a gate length is 40 nm, a film thickness of the gate insulating film in oxide-film conversion is 1 nm, a well concentration is 2E18 cm$^{-3}$, and the drain voltage is 1 V 2E18 cm$^{-3}$.

* * * * *